(12) United States Patent
Le Gallo et al.

(10) Patent No.: US 9,910,639 B2
(45) Date of Patent: Mar. 6, 2018

(54) RANDOM NUMBER GENERATION USING THRESHOLD SWITCHING MECHANISM

(71) Applicant: International Business Machines Corporation, Armonk, NY (US)

(72) Inventors: Manuel Le Gallo, Zurich (CH); Abu Sebastian, Zurich (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 165 days.

(21) Appl. No.: 14/953,730

(22) Filed: Nov. 30, 2015

(65) Prior Publication Data
US 2017/0153872 A1    Jun. 1, 2017

(51) Int. Cl.
| | |
|---|---|
| *H03B 29/00* | (2006.01) |
| *G06F 7/58* | (2006.01) |
| *G11C 13/00* | (2006.01) |
| *H01L 27/01* | (2006.01) |
| *H01J 3/00* | (2006.01) |

(52) U.S. Cl.
CPC .......... *G06F 7/588* (2013.01); *G11C 13/0004* (2013.01); *H01J 3/00* (2013.01); *H01L 27/01* (2013.01); *G06F 2207/58* (2013.01)

(58) Field of Classification Search
CPC ........ H01J 3/00; H01L 27/01; G06F 2207/58; G06F 7/588; G11C 13/004
USPC ............. 438/432; 317/234; 257/350; 331/78
See application file for complete search history.

(56) References Cited

U.S. PATENT DOCUMENTS

| | | | |
|---|---|---|---|
| 9,052,975 B2 | 6/2015 | Fukushima et al. | |
| 2006/0155551 A1* | 7/2006 | Ueda | H03K 3/84 331/78 |
| 2008/0121862 A1* | 5/2008 | Liu | G11C 13/0004 257/4 |
| 2009/0279350 A1* | 11/2009 | Chen | G11C 11/5678 365/163 |
| 2011/0220991 A1* | 9/2011 | Takaya | H01L 29/0623 257/330 |

OTHER PUBLICATIONS

S. Gaba "Resistive-RAM for Data Storage Applications" University of Michigan, 2014, pp. 1-142.
Y. Wang, et al. "A Novel True Random Number Generator Design Leveraging Emerging Memristor Technology" Proceedings of the 25th edition of Great Lakes Symposium on VLSI, May 20, 2015, p. 1-5.

* cited by examiner

*Primary Examiner* — Arnold Kinkead
(74) *Attorney, Agent, or Firm* — Cantor Colburn LLP; Daniel Morris

(57) ABSTRACT

Embodiments include a random number generation entity having at least one switching cell comprising a pair of electrodes and a chalcogenide layer arranged between the pair of electrodes and a pulse generating entity coupled with the electrodes of the switching cell. The pulse generating entity is configured to provide an excitation pulse to the switching cell. The random number generation entity also includes a detection entity configured to provide a detection signal indicating whether an electrical property measured at the switching cell exceeds or falls below a threshold value due to applying the excitation pulse to the switching cell and a random number generation entity adapted to generate a random number based on the detection signal of the detection entity.

18 Claims, 15 Drawing Sheets

RANDOM NUMBER GENERATION USING THRESHOLD SWITCHING MECHANISM

BACKGROUND

The present invention relates to random number generation. More specifically, the present document relates to a method and an entity for generating random numbers based on threshold switching mechanism.

SUMMARY

In one aspect, a random number generation entity is provided. The random number generation entity includes at least one switching cell comprising a pair of electrodes and a chalcogenide layer arranged between the pair of electrodes and a pulse generating entity coupled with the electrodes of the switching cell. The pulse generating entity being configured to provide an excitation pulse to the switching cell. The random number generation entity also includes a detection entity configured to provide a detection signal indicating whether an electrical property measured at the switching cell exceeds or falls below a threshold value due to applying the excitation pulse to the switching cell and a random number generation entity adapted to generate a random number based on the detection signal of the detection entity.

According to another aspect, a random number generator switching arrangement is provided. The random number generator switching arrangement includes a switching cell comprising a pair of electrodes and a chalcogenide layer arranged between the pair of electrodes and a pulse generating entity coupled with the electrodes of the switching cell, the pulse generating entity being configured to provide an excitation pulse to the switching cell in order to trigger a stochastic threshold switching process.

According to a further aspect, a method for generating random numbers is provided. The method includes providing an excitation pulse to a switching cell, the switching cell comprising a pair of electrodes and a chalcogenide layer arranged between the pair of electrodes, detecting whether an electrical property measured at the switching cell exceeds or falls below a threshold value due to applying the excitation pulse to the switching cell thereby obtaining a detection signal and generating a random number based on the detection signal.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

Figure 1:
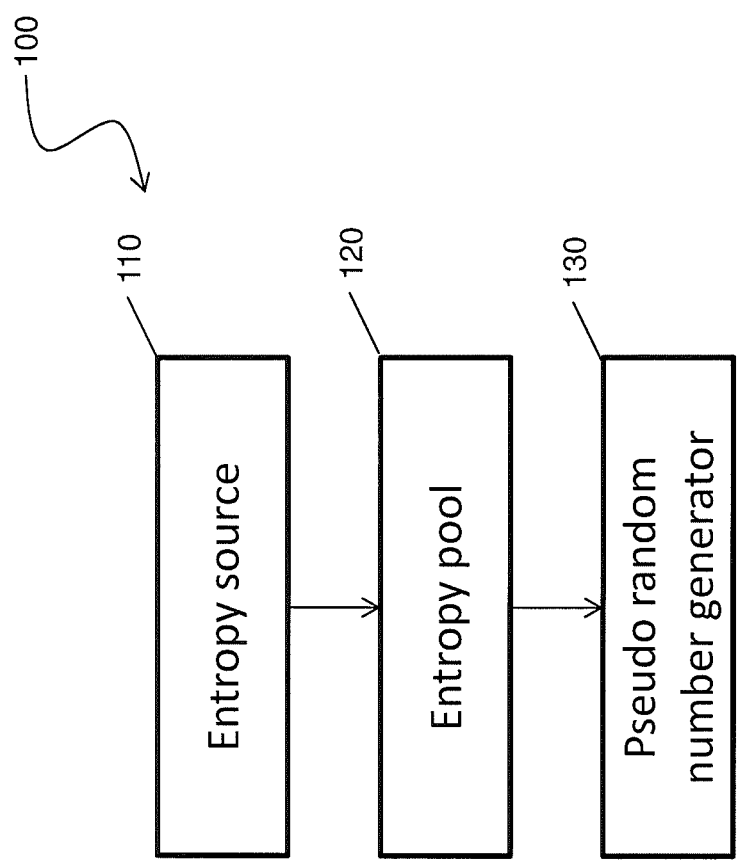
FIG. 1 depicts an example schematic representation of a random number generation entity.

The present invention may also include the following example features:

According to an example, the chalcogenide layer may comprise GeTe, SbTe, GeSb, GeSbTe, AgInSbTe, GaSb, Sb, AsTeGeSi, AsTeGe, AsSeGe, GeSe or ZnTe. These materials could also be alloyed (doped) with materials such as Si, N, $SiO_2$ and C. The materials show stochastic threshold switching properties which could be highly suitable for generating a random number.

According to an example, the pulse generating entity may be configured to provide an excitation pulse with a voltage level such that the chalcogenide layer shows a drop of electrical resistance from a higher resistance level to a lower resistance level as a stochastic process. In case of applying an excitation pulse with a peak voltage above a certain threshold value, the current within the switching cell may rise above a certain threshold value thereby causing threshold switching. The delay time between applying the pulse and the occurrence of a threshold switching event is found to be stochastic. By providing a time window for the occurrence of a threshold switching event (by means of defining the excitation pulse width), a generation of true random numbers is possible.

According to an example, the switching cell comprises a voltage-current-characteristic with a sub-threshold area and a current jump above the sub-threshold area, wherein the pulse generating entity is configured to provide an excitation pulse with a voltage level such that the electrical current through the switching cell exceeds the sub-threshold area. So, in other words, outside the sub-threshold area, the current does not continuously increase but there is a sudden increase (jump) of current which is believed to come from a combination of electronic and thermal effects in the chalcogenide layer when applying high electric field. Taking the beginning of the voltage pulse as a reference point, the current jump does not occur after a defined delay time but there is a stochastic variation which is exploited for generating random numbers. In case that the excitation pulse stops before the occurrence of the current jump, there is no threshold switching. In other words, the pulse width of the excitation pulse forms a time window in which the threshold switching has to occur. Thereby it is possible to take influence on the probability of occurrence of a switching event.

According to an example, the pulse generating entity is adapted to choose the voltage level and/or the pulse duration of the excitation pulse in order to obtain a desired probability of exceeding a given current threshold value. As described before, the pulse duration has strong influence on the probability of occurrence of a switching event. However, also the (peak) voltage level of the excitation pulse has significant influence on the delay time between applying the excitation pulse to the switching cell and the occurrence of threshold switching event thereby enabling a variation of the probability of exceeding a given current threshold value, i.e. a variation of the threshold switching probability.

According to an example, the pulse generating entity is adapted to choose the voltage level and/or the pulse duration of the excitation pulse such that, after providing the excitation pulse to the switching cell, the electrical resistance of the switching cell returns to the initial value without external influence. In other words, the voltage level and/or the pulse duration of the excitation pulse is chosen such that no structural changes within the material are caused (e.g. crystallization) but threshold switching is obtained by mere electronic effects which are automatically reversible after terminating the excitation pulse. Thereby, a high cycling endurance and operational speed could be achieved.

According to an example, the pulse generating entity is adapted to choose the voltage level and/or the pulse duration of the excitation pulse such that, even after terminating the excitation pulse, the electrical resistance of the switching cell remains in a low electrical resistance state. In other words, parameters of the excitation pulse are chosen such that—in case of threshold switching—structural changes within the material of the switching cell are caused (e.g. crystallization). By inducing structural changes, the information whether threshold switching occurred can be stored by the switching cell itself.

According to an example, the pulse generating entity is adapted to provide a reset pulse to the switching cell in order to reset the switching cell into a high electrical resistance state. In other words, structural changes induced by the excitation pulse can be canceled by applying a reset pulse to the switching cell. Thereby, the switching cell is transferred to its initial state.

According to an example, the pulse generating entity is adapted to provide multiple consecutive excitation pulses to the switching cell in order to generate a binary number comprising multiple bits. For example, excitation pulses can be provided with a pulse cycle in the µs-region, thereby obtaining random binary numbers in the Mbit/sec region. Thereby, a high performance random number generation could be obtained.

According to an example, the random number generation entity comprises multiple switching cells in parallel, the switching cells being coupled with a common pulse generating entity. Thereby, multiple bits of a random number can be generated at the same time which clearly increases the performance of random number generation.

According to an example, the switching cell is coupled in series with a resistive memory element adapted to store switching state based on structural change of the material properties. The excitation pulse does not cause a structural change of material properties within the switching cell but the high current flow in case of threshold switching causes a structural change of the material properties within the resistive memory element. The resistive memory element may be configured to show high cycling endurance, i.e. the caused structural changes can be cancelled many times (e.g. millions of cycles) without significant material degradation.

According to an example, the random number generation entity comprises a bias check entity adapted to control the voltage level and/or the pulse duration of the excitation pulse such that a desired probability of exceeding the current threshold value is achieved. In other words, the bias check entity may be adapted to control excitation pulse parameters such that the probability of threshold switching is kept within a desired range, e.g. in the region of 0.5. Thereby, a long-term drift of threshold switching probability out of a given range could be avoided.

According to an example, the random number generation entity comprises a bias tuning entity adapted to change the voltage level and/or the pulse duration of the excitation pulse according to environment parameters. Also environmental parameters, e.g. temperature drifts may cause a drift of threshold switching probability. As such, the random number generation entity may include a control loop for eliminating the influence of such environmental parameters.

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

The flowchart and block diagrams in the Figures illustrate the architecture, functionality, and operation of possible implementations of systems, methods, and devices according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates a schematic representation of a random number generation entity 100. The random number generation entity 100 comprises an entropy source 110. The entropy source 110 may be adapted to generate non-deterministic random numbers, specifically non-deterministic binary numbers comprising a plurality of bits. For example, the entropy source 110 may comprise one or more switching cells which are configured to adopt a state on a stochastically basis. The switching cells included in the entropy source 110 are described later on in closer detail.

The entropy source 110 is coupled with an entropy pool 120. The entropy pool 120 is adapted to receive the non-deterministic random numbers generated by the entropy source 110 and may generate non-deterministic random seeds based on the non-deterministic random numbers. The non-deterministic random seeds may be used as an initial value for initializing a pseudo-random number generator (PRNG) 130. In particular, the PRNG 130 may be a cryptographically secure PRNG. The PRNG 130 may be configured to generate cryptographically secure random numbers based on the non-deterministic random seeds.

Figure 2:
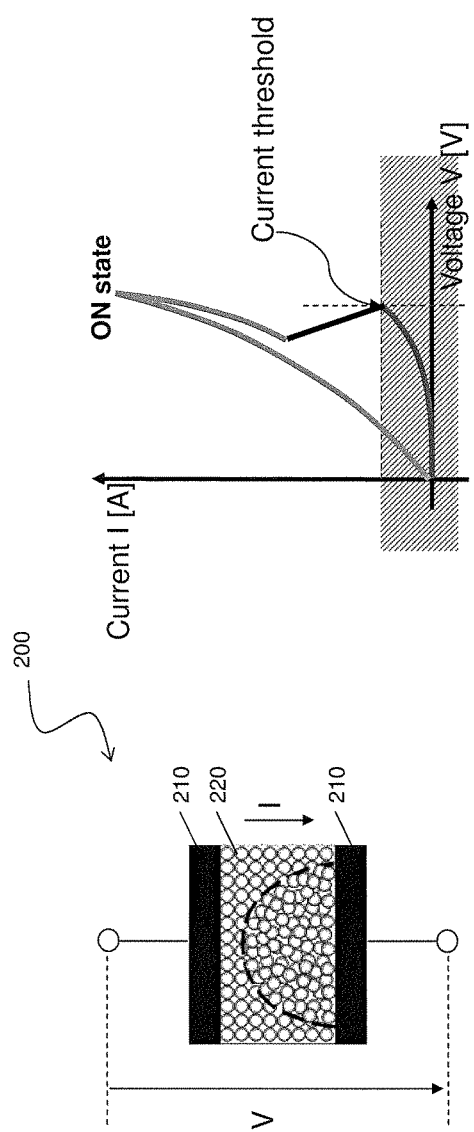
FIG. 2a depicts an example schematic illustration of a switching cell.
FIG. 2b illustrates an exemplary current-voltage-characteristic of a switching cell showing threshold switching properties.

FIG. 2a illustrates a schematic representation of the switching cell 200 included in the entropy source 100. The switching cell 100 comprises a pair of electrodes for electrically coupling 210 the switching cell 200. The electrodes 210 may be, for example, metal electrodes suitable for providing an electrical contact to an intermediate layer 220 provided between the pair of electrodes 210. The intermediate layer 220 may be made of a material showing stochastic electronic threshold switching properties. More in detail, materials comprising electronic threshold switching properties show a temporary increase in electrical conductivity beyond a certain applied voltage due to the generation of excess charge carriers (electrons or holes). In other words, due to applying a excitation pulse to the switching cell 200, electrical properties, namely the resistivity of the intermediate layer 220 is reduced leading to a temporary change of current flow through the switching cell 200. For example, the excitation pulse is a voltage pulse, e.g. a rectangular pulse or a pulse comprising a rising edge and a falling edge and a flat or essentially flat top portion between the rising and falling edges. As described in further detail below, the voltage value at the flat top portion of the voltage pulse may be a critical parameter for controlling the stochastic behavior of the switching cell 200.

The intermediate layer 220 may be made of phase-change materials, for example, GeTe, SbTe, GeSb, GeSbTe, AgInSbTe, GaSb, Sb or the like or ovonic threshold switching materials, for example, AsTeGeSi, AsTeGe, AsSeGe, GeSe or ZnTe. These materials could also be alloyed (doped) with materials such as Si, N, SiO2 and C. In a broader sense, the intermediate layer 220 may comprise a chalcogenide layer or any other materials exhibiting threshold switching as its main switching mechanism. The thickness of the chalcogenide layer is typically less than 100 nm, e.g. 90 nm, 80 nm, 70 nm, 60 nm or 50 nm. However, threshold switching has been observed down to a few nanometers in those materials, so even lower thicknesses of the chalcogenide layer may be possible. The lateral dimension of these devices will be typically less than 50 nm by 50 nm. The electrode material could be W, TiN, AlTiN, TaN or graphitic carbon.

FIG. 2a illustrates the current-voltage characteristic of an example switching cell showing threshold switching properties. Starting at zero voltage, when increasing the voltage applied to the switching cell, the current rises in a nonlinear but continuous way (lower curve). At a certain current value, the current-voltage characteristic bends upwardly in a discontinuous way. The current value is also referred to as current threshold. The voltage area leading to currents below the current threshold is referred to a sub-threshold area (hatched area). In other words, there is a discontinuous hop from a lower current value to a higher current value when choosing the voltage applied to the switching cell above a certain voltage threshold value. When further increasing the voltage (beyond the voltage threshold value, ON state), the current voltage curve may rise nonlinearly (after the hop) but again in a continuous way. When decreasing the voltage after reaching the ON state, the current decreases continuously.

Figure 3:
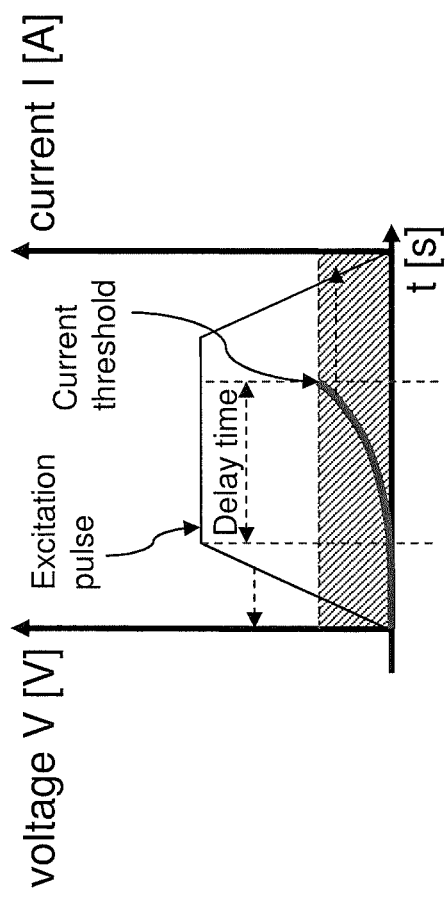
FIG. 3 illustrates an exemplary relationship between an applied excitation pulse and the initiated current threshold flow.

However, the current-voltage characteristic has a probabilistic nature, i.e. the delay time between applying an excitation pulse and a switching to the ON-state (rise of the current through the switching cell 200 above the current threshold value) is not a fixed value but is found to be stochastic. FIG. 3 shows an example excitation pulse (i.e. the voltage of the excitation pulse over time) against the electrical current (i.e current through the switching cell caused by applying the excitation pulse). As shown, there is a delay time between the excitation pulse arriving at the peak voltage (beginning of top portion of the excitation pulse) and the electric current arriving at the current threshold. However, the delay time varies in a probabilistic manner. By appropriately choosing the pulse width, the probability of occurrence of an increase of the current above a current threshold (in the following also referred to as switching event) can be adjusted.

Figure 4:
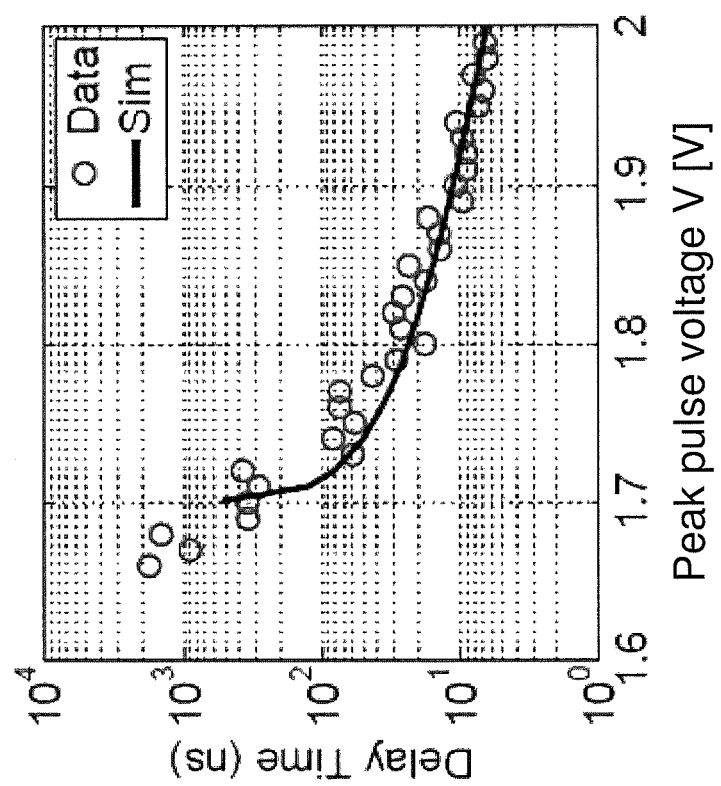
FIG. 4 illustrates an exemplary dependency of the delay time on the peak voltage of the excitation pulse.

FIG. 4 shows the delay time vs. the peak pulse voltage. The circles show the simulated data whereas the solid line shows simulated data (in the present example, a 90 nm thickness of the intermediate layer has been used). In the area around 1.7V, the delay time fluctuates significantly (e.g. between 300 ns and 2000 ns), thus the voltage region may be used for obtaining a delay time having a probabilistic nature.

Figure 5B:
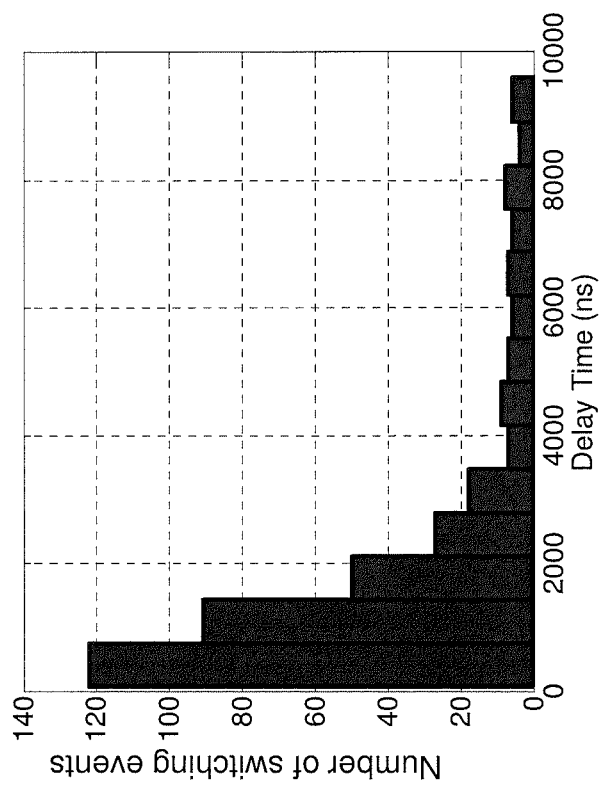
FIG. 5b illustrates the exemplary cumulated number of switching events associated with a certain delay time range.
Figure 5A:
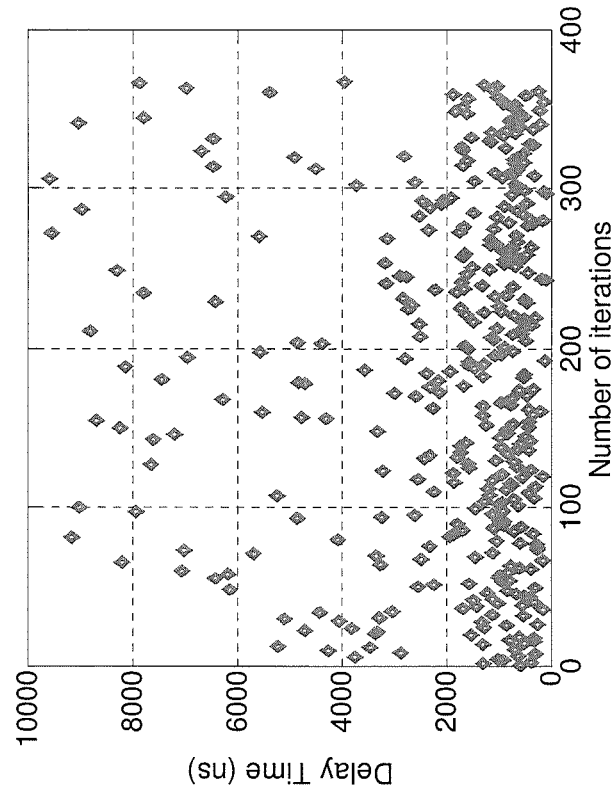
FIG. 5a illustrates an exemplary variation of delay time over multiple excitation pulses.

FIG. 5a shows the probabilistic nature of the delay time in closer detail. A plurality of very long excitation pulses (e.g. an excitation pulse width of 10 μs or longer) have been applied to the switching cell 200 and the delay time has been measured after which the switching event occurs. FIG. 5b shows a similar diagram illustrating the cumulated number of switching events in a certain delay time region. As is clear from FIGS. 5a and 5b, most switching events occur in the delay time region below 2 μs and the number of switching events decreases towards higher delay time values.

Figure 6:
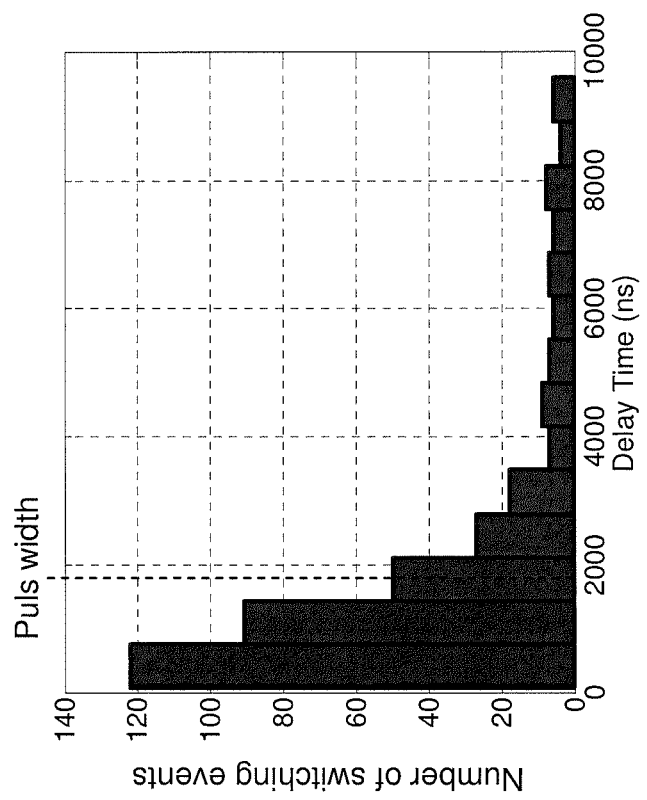
FIG. 6 illustrates an exemplary selection of the pulse width depending on the distribution of the cumulated number of switching events.

FIG. 6 shows an example specification of the pulse width based on the switching event distribution according to FIG. 5b. In order to obtain a probability of switching of the switching cell in the area of 50% on a long term basis, the pulse width may be chosen such that the integral over the number of switching events at both sides of the switching event distribution is equal or essentially equal. In the present embodiment, the pulse width has been chosen slightly below 2 μs. By fixing the applied switching pulse width, the switching cell 200 may switch if the delay time is smaller than the pulse width and the switching cell 200 may not switch is that the delay time is longer than the pulse width.

So, in other words, the pulse width defines a gate in which the switching event has to occur in order to cause a switching event.

Figure 7:
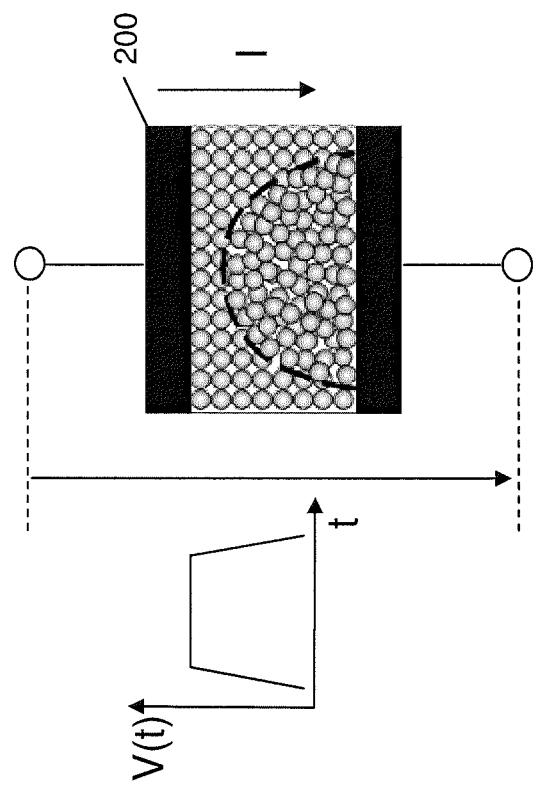
FIG. 7 illustrates applying an excitation pulse to a switching cell.

FIG. 7 shows a switching cell 200 being applied with an excitation pulse in order to cause a switching event. As described before, the peak value of the voltage pulse may be chosen such that the delay time shows a high probabilistic distribution (steep curve portion in FIG. 4, e.g. around 1.7V) and the pulse width may be chosen such that the switching event occurs with a probability of approximately 0.5. When applying the excitation pulse to the switching cell 200 it is investigated whether a switching event occurs. More in detail, electrical properties measured and the switching cell 200 are investigated, for example, the electrical resistance of the switching cell 200 and/or the electric current flowing through the switching cell 200 caused by the excitation pulse. If the switching cell 200 undergoes threshold switching, a first binary value (e.g. logical one) may be detected, otherwise a second binary value (e.g. logical zero) may be detected.

It is worth mentioning, that in case of applying a limited current flow through the switching cell 200 by applying an excitation pulse below a certain pulse duration, the switching event is an automatically reversible event, i.e. after termination of the switching pulse, the electrical properties of the switching cell 200 return to its initial values without any external influence even if threshold switching occurred (e.g. a reset pulse etc.). More in detail, in case of a threshold switching event, the electrical resistance of the switching cell 200 is temporarily reduced and—after terminating the excitation pulse—the electrical resistance of the switching cell returns to the initial high resistance level. So, in other words, there are no or essentially no structural changes of the material caused by threshold switching but threshold switching uses only reversible electronic effects (e.g. generation of excess carriers). The excitation pulse parameters are chosen such that threshold switching is performed in the automatically reversible operating range.

However, in case that an excitation pulse causing a higher current through the switching cell 200 in case of threshold switching is chosen, structural changes within the intermediate layer 220 of the switching cell 200 may occur (e.g. crystallization) and the cell may go into a steady low resistance state. By investigating the electrical resistance of the switching cell, a logical one or logical zero can be detected. In order to reset the switching cell into a high resistance state, a reset pulse may be applied to the switching cell. So, in other words, in case of causing structural changes within the switching cell 200, the switching cell 200 does not automatically return in its initial state but a reset (by external influence, e.g. applying a reset pulse) is necessary. It is worth mentioning, that frequently occurring structural changes lead to a deterioration of the material of the intermediate layer, i.e. lower the endurance of the switching cell 200. However, the steady low resistance state can be used to store a probabilistic value.

Figure 8:
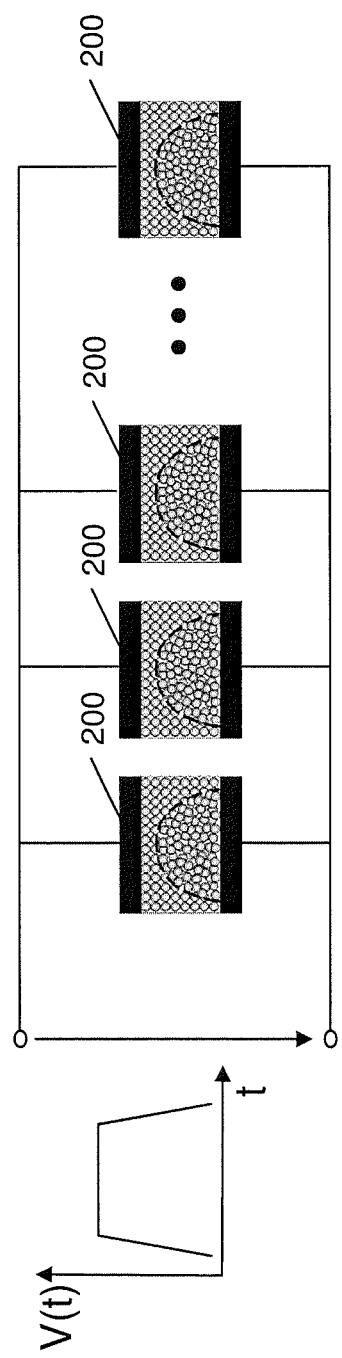
FIG. 8 illustrates a cascade of parallel switching cells according to an embodiment of the invention.

FIG. 8 shows a cascade of switching cells 200 coupled in parallel. The cascade of switching cells 200 can be coupled with an excitation pulse generation entity in order to apply an excitation pulse to the switching cells 200 included in the switching cell cascade. Thereby, a plurality of random binary numbers can be obtained in parallel which clearly increases the performance of the random number generator.

Figure 9:
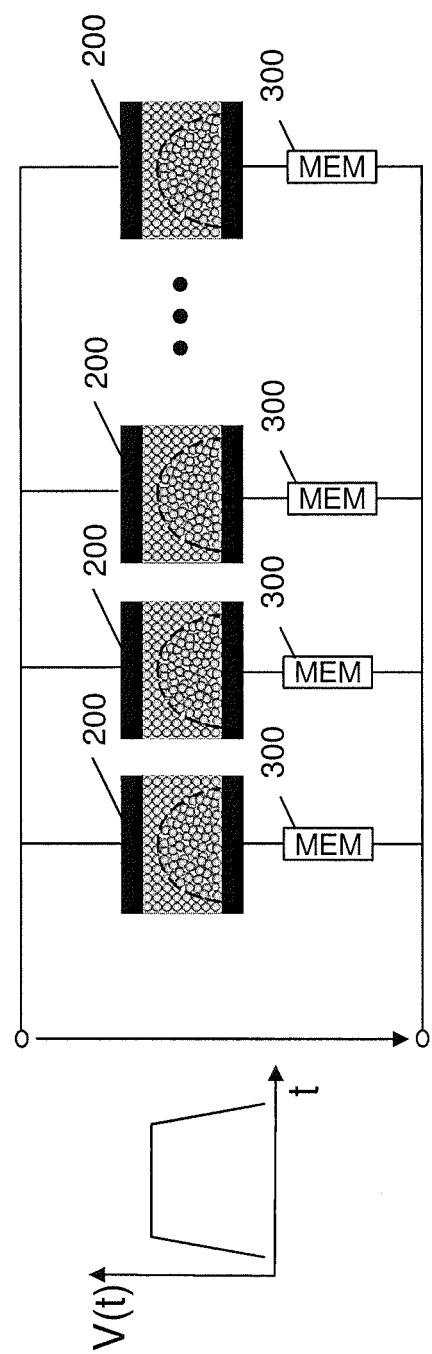
FIG. 9 illustrates a cascade of switching cells and resistive memory elements according to an embodiment of the invention.

FIG. 9 shows a cascade of switching cells 200 similar to FIG. 8, wherein each switching cell 200 is coupled with a resistive memory element 300 (MEM). The memory element may be chosen such that in case of a current flow through the switching cell above current threshold value (i.e. threshold switching occurs), a structural change of the material included in the resistive memory element 300 occurs whereas there is no structural change of material within the switching cell itself. So, after termination of the excitation pulse, the switching cell automatically returns to its initial state whereas the resistive memory element 300 stays in the changed state until a reset in performed. The resistive memory element 300 may comprise a high-endurance material showing no or essentially no degradation even after many duty cycles, e.g. a resistive memory element based on $HfO_2$ or $TaO_2$. It is worth mentioning that in the electrical wiring between the excitation pulse generation entity and the switching cell(s) 200 according to FIGS. 7 to 9, one or more electronic devices (resistors, transistors, capacities etc.) can be included in order to limit the current through the switching cell 200, respectively, control the access to the switching cell (switching cell selection).

Figure 10:
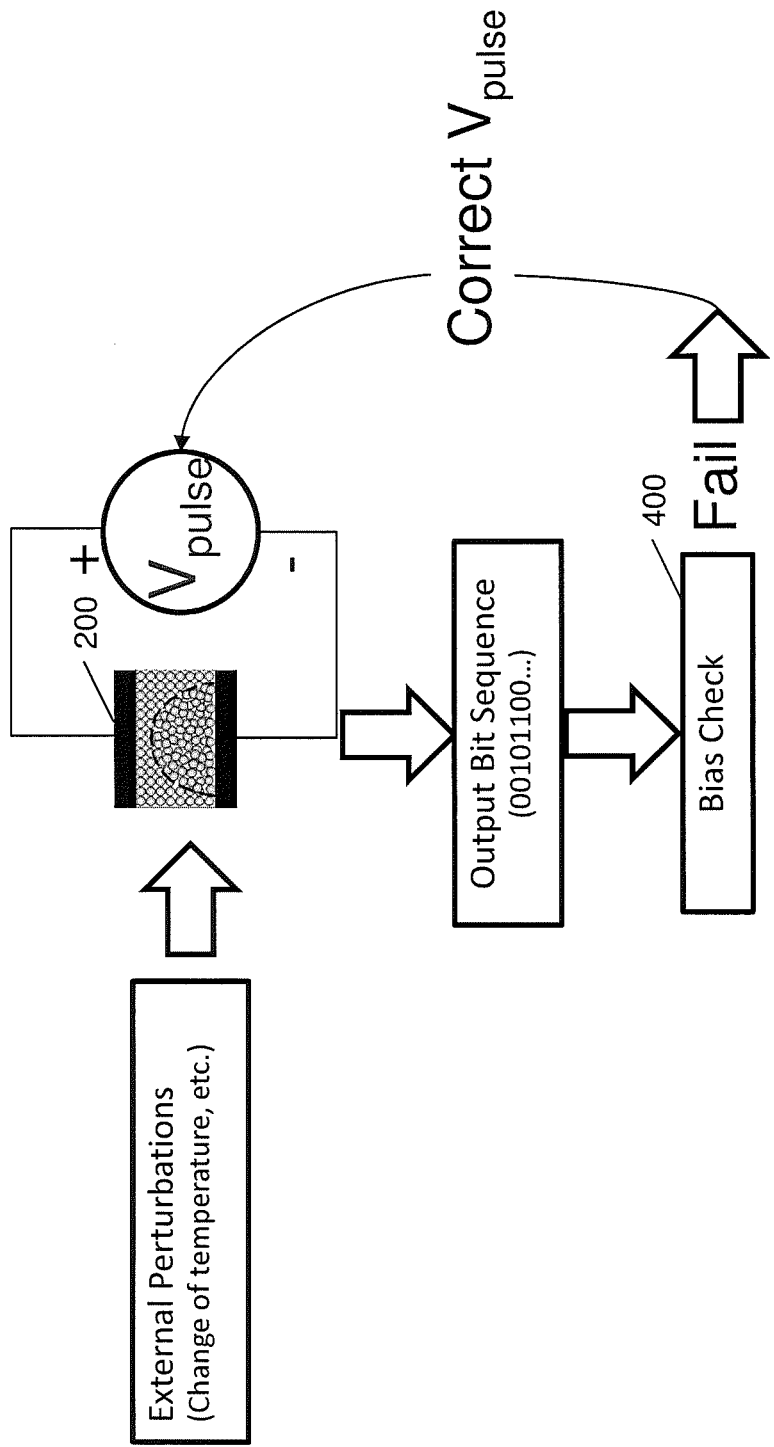
FIG. 10 illustrates an exemplary control mechanism for controlling the probability of threshold switching.

FIG. 10 shows a switching cell 200 included in a control loop for controlling the peak voltage value of the excitation pulse. The switching cell 200 may be prone to external perturbations, e.g. temperature changes, vibrations etc. Thereby, probability variations may occur leading to the fact that e.g. the switching event occurs more often, i.e. a certain binary value (e.g. logical "1") is generated with a higher probability than the other binary value (e.g. logical "0"). In order to avoid an undesired probability shift, the output bit sequence derived from the switching cell 200 is provided to a bias check entity 400. The bias check entity 400 may be adapted to determine whether the probability of occurrence of a switching event is in the desired range. If not, the bias check entity 400 may be adapted to trigger a change of excitation pulse peak voltage $V_{pulse}$ such that the probability of occurrence of a switching event is within the desired range. Alternatively or in combination with tuning the excitation pulse peak voltage, also the pulse width of the excitation pulse may be changed in order to obtain a probability of occurrence of a switching event within the desired range. So, in other words, the arrangement according to FIG. 10 leads to a controlling of the probability of occurrence of a switching event according to a desired value.

Figure 11:
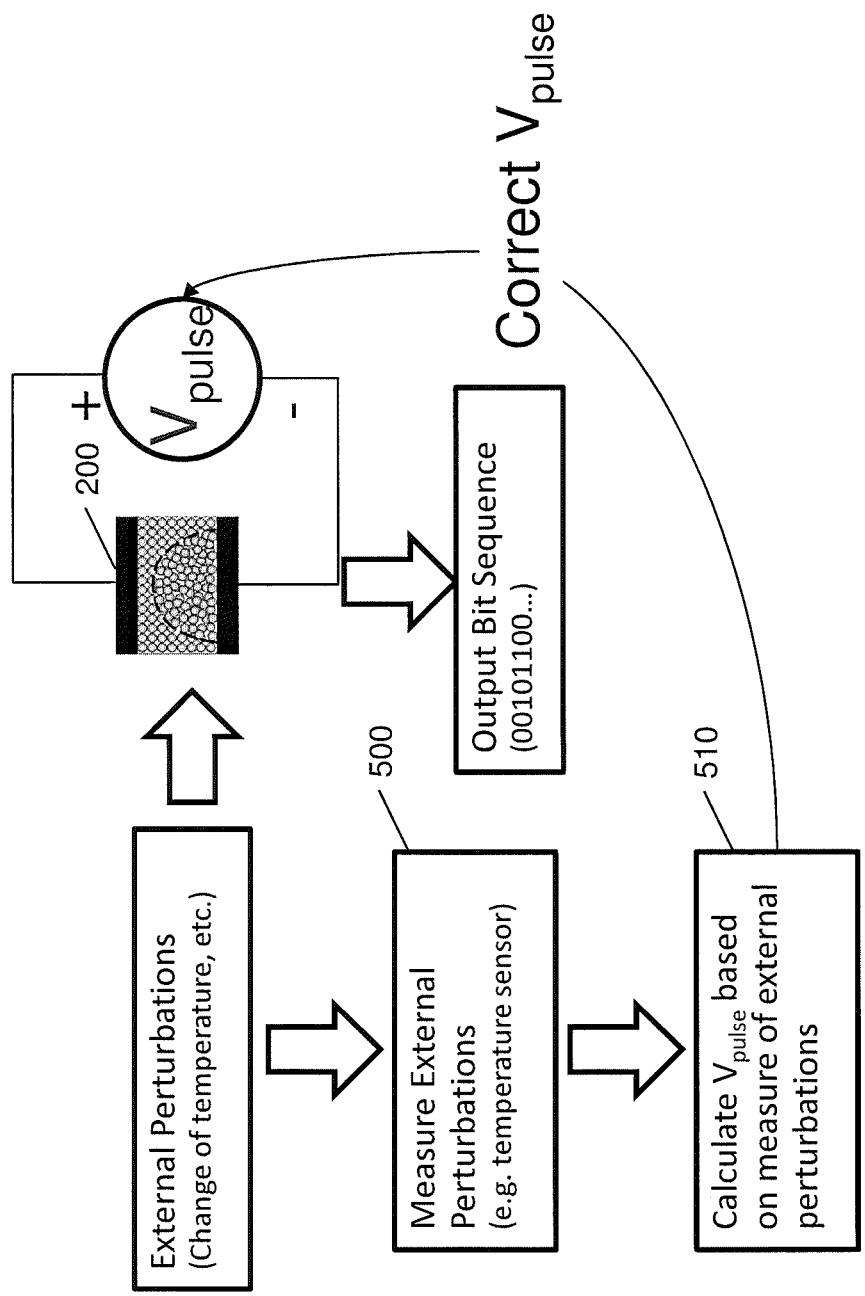
FIG. 11 illustrates an exemplary control mechanism for controlling the probability of threshold switching based on external perturbation parameters.

FIG. 11 illustrates a switching cell 200 included in a control loop for controlling the peak voltage value of the excitation pulse based on external perturbation measures. First, a perturbation value (e.g. temperature) may be measured by a measurement entity 500. For example, the measurement entity 500 may be a temperature sensor being arranged in close proximity to the switching cell. Based on the measurement values provided by the measurement entity 500, a control entity 510 calculates a control value, e.g. a excitation pulse peak voltage value $V_{pulse}$. In other words, the control value may be chosen such that variations in the probability of occurrence of a switching event caused by external perturbations, e.g. temperature variations are compensated. In yet other words, the control loop according to FIG. 11 leads to a decoupling of the probability of occurrence of a switching event from external perturbations (e.g. temperature variations).

It is worth mentioning that the embodiments according to FIGS. 10 and 11 can be combined in order to control the probability of occurrence of a switching event to a desired value and, at the same time, compensate a drift of the probability due to temperature variations.

Figure 12:
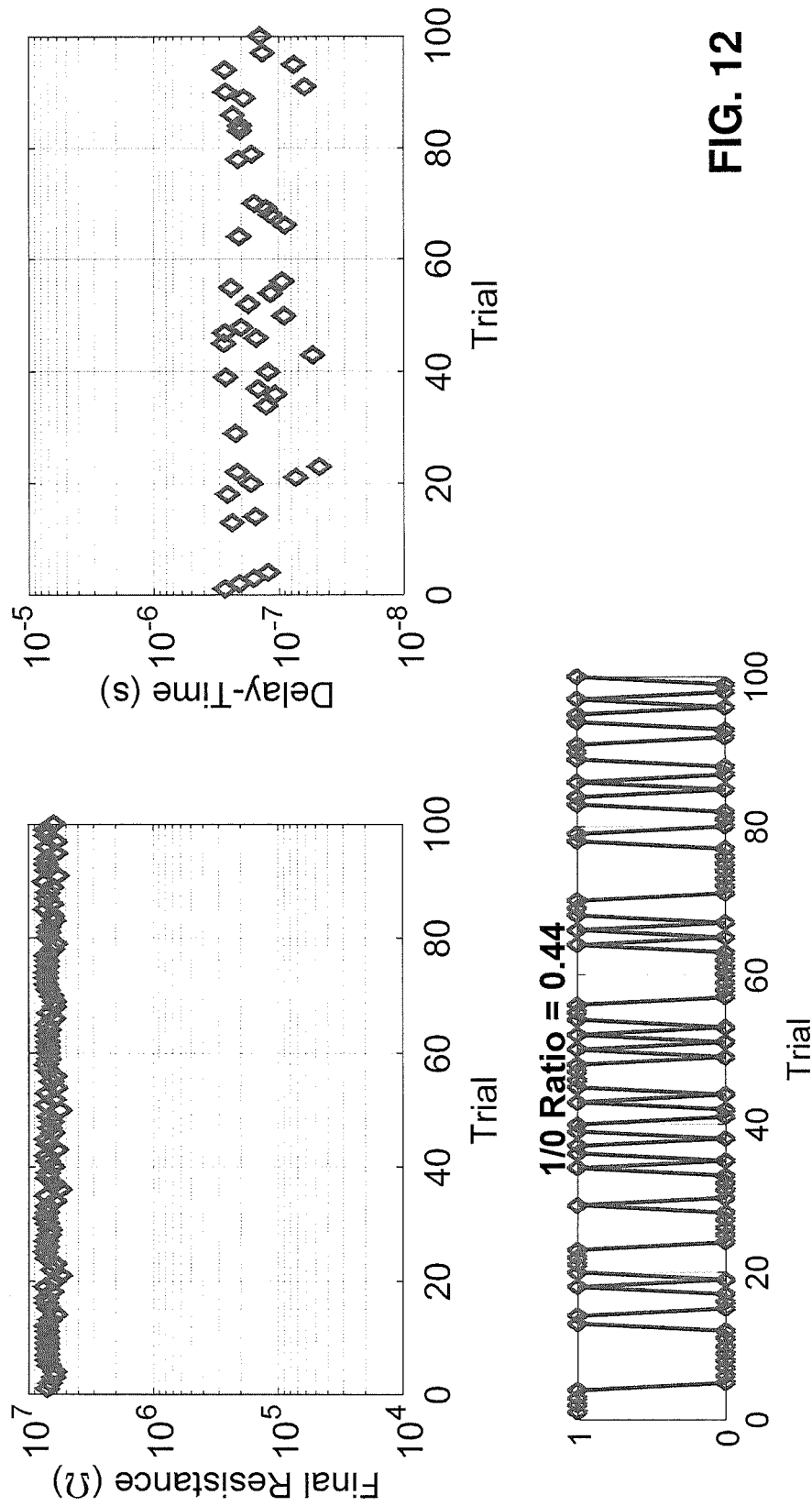
FIG. 12 shows exemplary experimental results of random number generation based on threshold switching mechanism according to a first embodiment.

FIG. 12 shows experimental results of random number generation due to threshold switching according to a first embodiment. In the first embodiment, the current through the switching cell has been chosen such that no structural changes within the switching cell are induced, i.e. the switching effect is a mere reversible electronic effect and the electrical switching cell resistance returns to its initial value after termination of the switching pulse (no reset necessary). So as shown in the upper left figure, the final resistance after finishing the pulse is in the region of $8*10^6$ Ohm. For detecting threshold switching, the electrical current through the switching cell is sensed and compared with a certain current threshold value. In the embodiment, the delay time varies in the region between $4*10^{-8}$ s and $3*10^{-7}$ s leading to a ratio of detected ones (e.g. threshold switching occurs) and detected zeros (e.g. no threshold switching occurs) of 0.44. In the present example, a pulse width of 300 ns and an excitation pulse peak voltage of 1.72V have been chosen.

Figure 13:
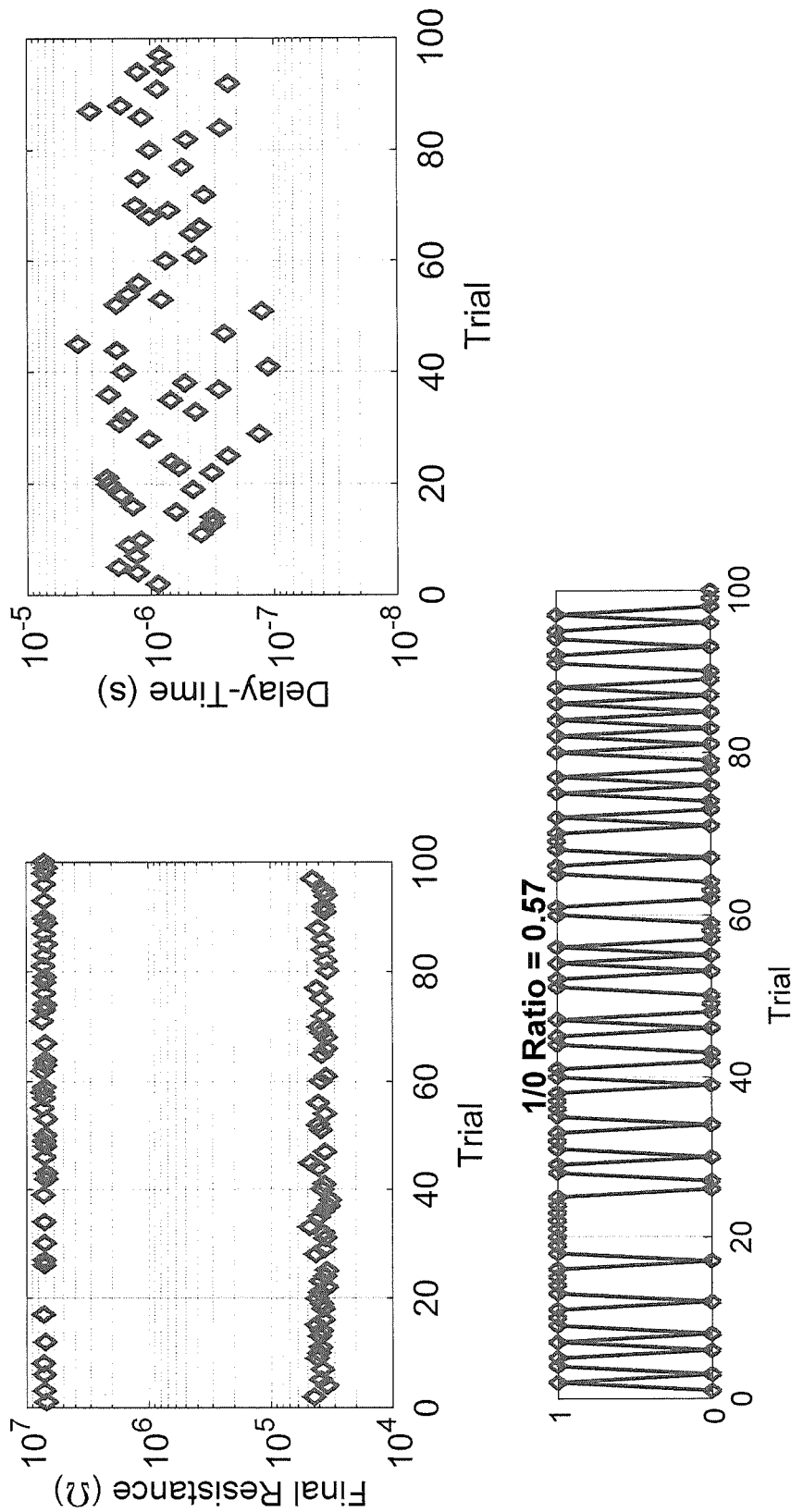
FIG. 13 shows exemplary experimental results of random number generation based on threshold switching mechanism according to a second embodiment.

FIG. 13 shows further experimental results of random number generation due to threshold switching according to a second embodiment. In the second embodiment, the current through the switching cell, respectively, the pulse width of the excitation pulse have been chosen such that structural changes (e.g. crystallization of material (e.g. phase-change material PCM)) within the switching cell are induced, i.e. the electrical switching cell resistance does not automatically return to its initial value after termination of the switching pulse but a reset is necessary. So as shown in the upper left figure, the final resistance after finishing the pulse strongly depends on the fact if threshold switching occurred or not. If there is no threshold switching, the final resistance of the switching cell is in the region of $8*10^6$ Ohm (high resistance state). However, if threshold switching occurs, the final resistance of the switching cell is in the region of $5*10^4$ Ohm (low resistance state). For detecting threshold switching, the switching cell resistance may be measured after terminating the excitation pulse. In the embodiment, the delay time varies in the region between $1*10^{-7}$ s and $5*10^{-6}$ s leading to a ratio of detected ones and detected zeros of 0.57. In the present example, a pulse width of 5 µs and an excitation pulse peak voltage of 1.7V have been chosen. In order to reset the switching cell (leading to a return to high resistance state), a reset pulse with a peak level of 6V has been chosen.

Figures 14A, 14B:
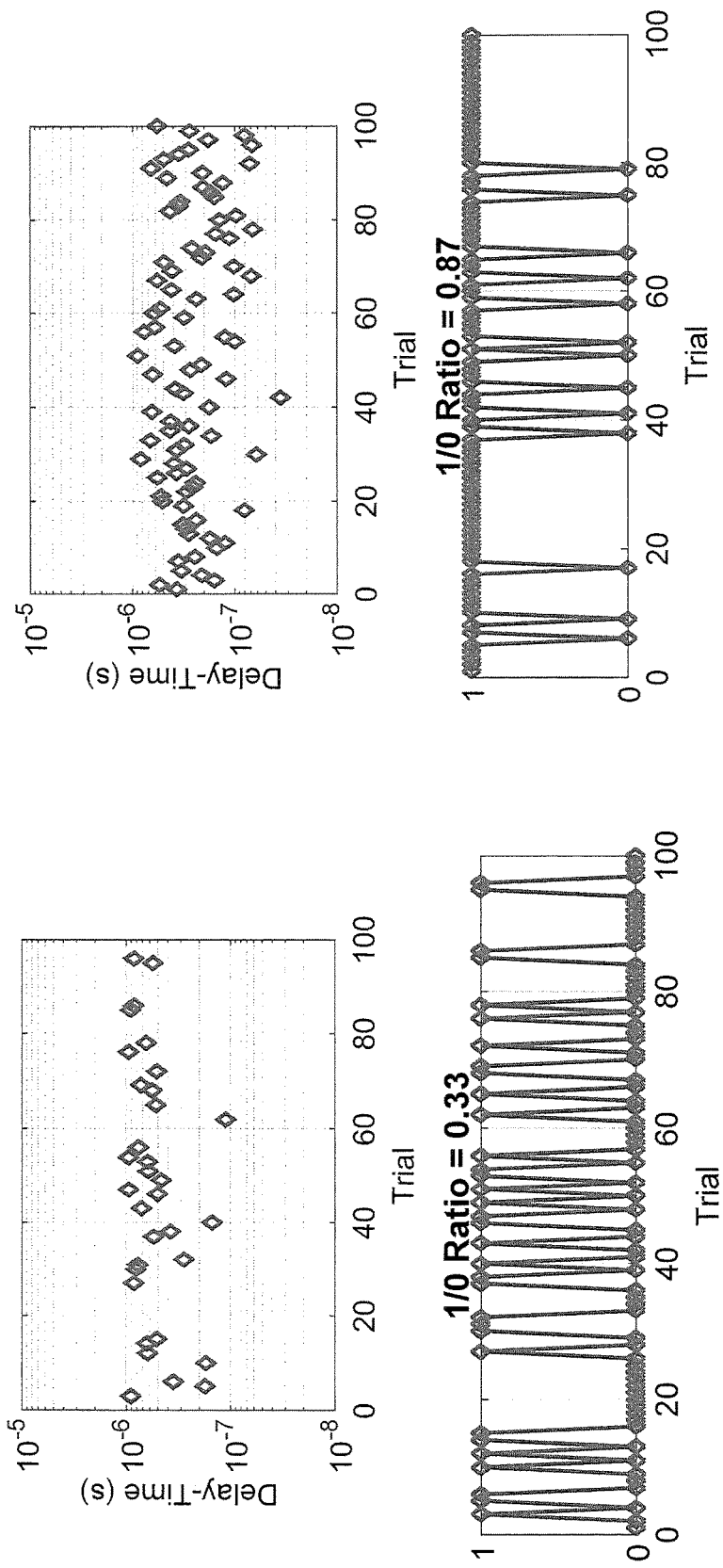
FIGS. 14a and 14b shows an exemplary comparison of random number generation based on threshold switching mechanism using different peak voltage values of the excitation pulse.

FIG. 14a and FIG. 14b show experimental results of random number generation due to threshold switching when applying excitation pulses with different voltage peak levels. In the experiment of FIG. 14a, an excitation pulse peak voltage of 1.7V has been chosen whereas in the experiment of FIG. 14b, the peak voltage of the excitation pulse was 1.72V. In both experiments, the pulse width of the excitation pulse was 1 µs. As shown in the lower graph of FIG. 14a, the ratio of detected ones (e.g. threshold switching occurs) and detected zeros (e.g. no threshold switching occurs) is 0.33 whereas in FIG. 14b, the ratio of detected ones (e.g. threshold switching occurs) and detected zeros (e.g. no threshold switching occurs) is 0.87. So, by changing the peak voltage of the excitation pulses, the probability of occurrence of a threshold switching event can be significantly varied. Alternatively or in addition, also variations in pulse width of the excitation pulse leads to a variation of the probability threshold switching.

Figure 15:
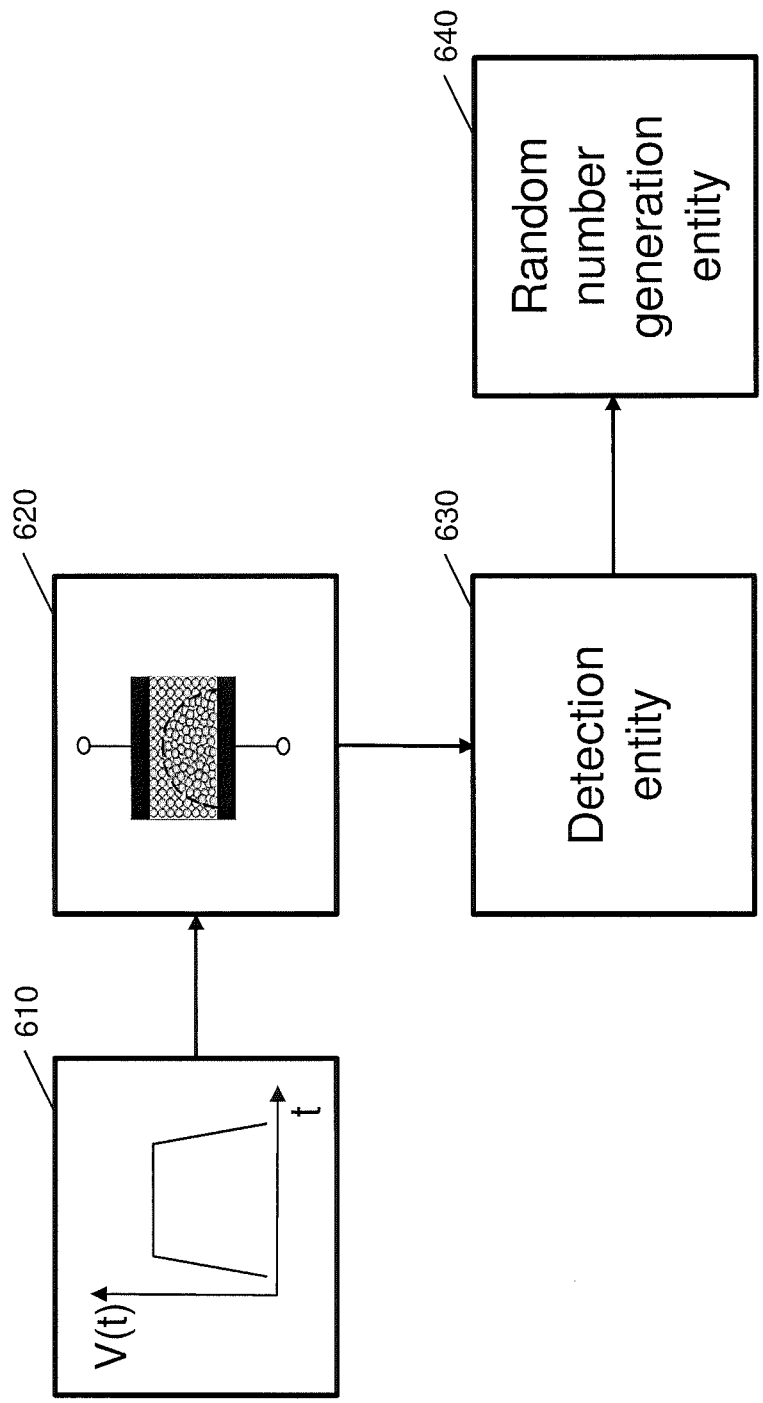
FIG. 15 illustrates an example block diagram of a random number generation entity.

FIG. 15 shows a schematic block diagram of a random number generation entity 600 according to an embodiment of the invention. The random number generation entity 600 comprises a pulse generation entity 610. The pulse generation entity 610 is adapted to generate excitation pulses, e.g. rectangular pulses or pulses comprising a parallelogram-like shape (rectangular pulses with slanted rising and falling edges) to one or more switching cells 620. For example, the switching cell(s) 620 may be part of a semiconductor chip and/or an integrated circuit. The switching cell(s) 620 may be coupled with a detection entity 630, the detection entity 630 being adapted to detect whether a threshold switching event occurred initiated by the excitation pulse. The detection entity 630 may be configured to measure the electrical current flowing through the switching cell(s) 620 in order to detect threshold switching by comparing the measured electrical current with a current threshold value. According to another embodiments, the detection entity 630 may be adapted to measure the electrical resistance of the switching cell(s) 620 during the excitation pulse or after termination of the excitation pulse thereby deriving information regarding the occurrence of a threshold switching event. The detection entity 630 may be coupled with a random number generation entity 640 being adapted to generate a random number based on the information provided by the detection entity 630. According to another embodiment, the detection entity 630 and the random number generation entity 640 may be included in a single entity performing the detection of the threshold switching event as well as the generation of random numbers.

Summing up, a system and a method using the stochasticity of threshold switching dynamics in order to generate random streams of bits have been disclosed. Threshold switching is believed to come from a combination of electronic and thermal effects in the material when a high electric field is applied. Therefore, when threshold switching occurs, it is not necessarily followed by a structural change within the switching cell, and its stochastic nature is not linked to the latter. By applying a constant voltage pulse of certain duration, the device (i.e. the switching cell) will switch stochastically with a certain probability. The switching event can be detected by reading the cell resistance or detecting the rise of electrical current upon switching. The probabilistic nature of the switching event is a consequence of the threshold switching mechanism itself. The device switches after a certain delay-time, which is found to be stochastic. Therefore, by fixing the applied switching pulse width, the device will sometimes switch (if the delay-time is smaller than the pulse width) and sometimes not (if the delay-time is longer than the pulse width). In contrast, previous implementations with RRAM use the variability of the SET state or the probabilistic nature of the formation of conducting filaments in the device as source of stochasticity for random number generation. The switching probability can be well tuned by changing the applied voltage amplitude, the pulse width, or the RESET voltage in case of a phase-change memory device. Therefore, virtually any number can be generated by tuning the switching probability using those methods.

The systems and methods could be advantageous because threshold switching is typically a temporary increase in conductivity beyond a certain applied voltage due to the generation of excess charge carriers (electrons or holes), i.e. a mere electronic effect and can therefore iterated may times without material degradation. Therefore, threshold switching mechanism may provide a much higher cycling endurance and operational speed which will make this particular physical mechanism favorable for the application of random number generation.

The invention claimed is:
1. A random number generation entity comprising:
a switching cell comprising a pair of electrodes and a chalcogenide layer arranged between the pair of electrodes;

a pulse generating entity coupled with the electrodes of the switching cell, the pulse generating entity being configured to provide an excitation pulse to the switching cell;
a detection entity configured to provide a detection signal indicating whether an electrical property measured at the switching cell exceeds or falls below a threshold value due to applying the excitation pulse to the switching cell; and
a random number generation entity adapted to generate a random number based on the detection signal of the detection entity,
wherein the switching cell comprises a voltage-current-characteristic with a sub-threshold area and a current jump above the sub-threshold area, wherein the pulse generating entity is configured to provide an excitation pulse with a voltage level such that an electrical current through the switching cell exceeds the sub-threshold area.

2. The random number generation entity of claim 1, the chalcogenide layer comprising GeTe, SbTe, GeSb, GeSbTe, AgInSbTe, GaSb, Sb, AsTeGeSi, AsTeGe, AsSeGe, GeSe or ZnTe, including a doping of using Si, N, $SiO_2$ and C.

3. The random number generation entity of claim 1, the pulse generating entity being configured to provide an excitation pulse with a voltage level such that the chalcogenide layer shows a drop of electrical resistance from a higher resistance level to a lower resistance level as a stochastic process.

4. The random number generation entity of claim 1, the pulse generating entity being adapted to choose the voltage level and/or the pulse duration of the excitation pulse in order to obtain a desired probability of exceeding a given current threshold value.

5. The random number generation entity of claim 1, the pulse generating entity being adapted to choose the voltage level and/or the pulse duration of the excitation pulse such that, after providing the excitation pulse to the switching cell, the electrical resistance of the switching cell returns to the initial value without external influence.

6. The random number generation entity of claim 1, the pulse generating entity being adapted to choose the voltage level and/or the pulse duration of the excitation pulse such that, even after terminating the excitation pulse, the electrical resistance of the switching cell remains in a low electrical resistance state.

7. The random number generation entity of claim 6, the pulse generating entity being adapted to provide a reset pulse to the switching cell in order to reset the switching cell into a high electrical resistance state.

8. The random number generation entity of claim 1, the pulse generating entity being adapted to provide multiple consecutive excitation pulses to the switching cell in order to generate a binary number comprising multiple bits.

9. The random number generation entity of claim 1, comprising multiple switching cells in parallel, the switching cells being coupled with a common pulse generating entity.

10. The random number generation entity of claim 1, the switching cell being coupled in series with a resistive memory element adapted to store switching state based on structural change of the material properties.

11. The random number generation entity of claim 1, comprising a bias check entity adapted to control the voltage level and/or the pulse duration of the excitation pulse such that a desired probability of exceeding the current threshold value is achieved.

12. The random number generation entity of claim 1, comprising a bias tuning entity adapted to change the voltage level and/or the pulse duration of the excitation pulse according to environment parameters.

13. A random number generator switching arrangement comprising:
a switching cell comprising a pair of electrodes and a chalcogenide layer arranged between the pair of electrodes;
a pulse generating entity coupled with the electrodes of the switching cell, the pulse generating entity being configured to provide an excitation pulse to the switching cell in order to trigger a stochastic threshold switching process,
wherein the switching cell comprising a voltage-current-characteristic with a sub-threshold area and a current jump above the sub-threshold area, the pulse generating entity being configured to provide an excitation pulse with a voltage level such that an electrical current through the switching cell exceeds the sub-threshold area.

14. The random number generation entity of claim 13, the chalcogenide layer comprising GeTe, SbTe, GeSb, GeSbTe, AgInSbTe, GaSb, Sb, AsTeGeSi, AsTeGe, AsSeGe, GeSe or ZnTe, including a doping of using Si, N, $SiO_2$ and C.

15. The random number generation entity of claim 13, the pulse generating entity being configured to provide a excitation pulse with a voltage level such that the chalcogenide layer shows a drop of electrical resistance from a higher resistance level to a lower resistance level as a stochastic process.

16. The random number generation entity of claim 13, the pulse generating entity being adapted to choose the voltage level and/or the pulse duration of the excitation pulse in order to obtain a desired probability of exceeding a given current threshold value.

17. The random number generation entity of claim 13, the pulse generating entity:
being adapted to choose the voltage level and/or the pulse duration of the excitation pulse such that, after providing the excitation pulse to the switching cell, the electrical resistance of the switching cell returns to the initial value without external influence; or
being adapted to choose the voltage level and/or the pulse duration of the excitation pulse such that, even after terminating the excitation pulse, the electrical resistance of the switching cell remains in a low electrical resistance state and the pulse generating entity is adapted to provide a reset pulse to the switching cell in order to reset the switching cell into a high electrical resistance state.

18. A Method for generating random numbers, the method comprising:
providing an excitation pulse to a switching cell, the switching cell comprising a pair of electrodes and a chalcogenide layer arranged between the pair of electrodes;
detecting whether an electrical property measured at the switching cell exceeds or falls below a threshold value due to applying the excitation pulse to the switching cell thereby obtaining a detection signal; and
generating a random number based on the detection signal,
wherein the switching cell comprises a voltage-current-characteristic with a sub-threshold area and a current jump above the sub-threshold area, wherein the pulse generating entity is configured to provide an excitation pulse with a voltage level such that an electrical current through the switching cell exceeds the sub-threshold area.

* * * * *